US008635393B2

(12) United States Patent
Dortu et al.

(10) Patent No.: US 8,635,393 B2
(45) Date of Patent: Jan. 21, 2014

(54) SEMICONDUCTOR MEMORY HAVING A SHORT EFFECTIVE WORD LINE CYCLE TIME AND METHOD FOR READING DATA FROM A SEMICONDUCTOR MEMORY OF THIS TYPE

(75) Inventors: Jean-Marc Dortu, Tokyo (JP); Wolfgang Spirkl, Germering (DE)

(73) Assignee: Qimonda AG, Munich (DE)

( * ) Notice: Subject to any disclaimer, the term of this patent is extended or adjusted under 35 U.S.C. 154(b) by 532 days.

(21) Appl. No.: 11/333,758

(22) Filed: Jan. 17, 2006

(65) Prior Publication Data

US 2007/0030751 A1  Feb. 8, 2007

Related U.S. Application Data

(63) Continuation of application No. PCT/EP2004/007686, filed on Jul. 12, 2004.

(30) Foreign Application Priority Data

Jul. 16, 2003  (DE) .................................. 103 32 314

(51) Int. Cl.
*G06F 12/06* (2006.01)
(52) U.S. Cl.
USPC ............................................... 711/5; 711/105
(58) Field of Classification Search
None
See application file for complete search history.

(56) References Cited

U.S. PATENT DOCUMENTS 5,497,478 A     3/1996  Murata
6,006,307 A *  12/1999  Cherukuri ...................... 711/114
6,484,278 B1 * 11/2002  Merritt et al. .................. 714/719

7,127,573 B1 * 10/2006  Strongin et al. ............... 711/158
2002/0141230 A1  10/2002  Tauber et al.
2002/0147883 A1  10/2002  Hsu et al.

(Continued)

FOREIGN PATENT DOCUMENTS

DE        4206286       9/1992
WO      03/042836       5/2003

OTHER PUBLICATIONS

PCT International Search Report dated Jan. 14, 2005.

(Continued)

*Primary Examiner* — Kaushikkumar Patel
(74) *Attorney, Agent, or Firm* — Patterson & Sheridan, LLP

(57)  ABSTRACT

The invention relates to a method for reading data from a semiconductor memory, said method comprising the following steps in this order: providing at least one first memory bank and at least one shadow memory bank which are each designed to store a multiplicity of binary data items, the same data as in the first memory bank being stored in the shadow memory bank; receiving a command for reading data which are to be read from the first memory bank; utilizing a state checking device of the semiconductor memory to check whether the first memory bank is in an open memory bank state, and, if the first memory bank is in the open memory bank state, reading the data which are to be read from the at least one shadow memory bank, and, if the first memory bank is not in the open memory bank state, reading the data which are to be read from the first memory bank, the open memory state being such a memory state of the memory bank which does not allow the data which are to be read to be read without previously closing an open word line of the memory bank. The invention also relates to a corresponding semiconductor memory.

10 Claims, 3 Drawing Sheets

(56) References Cited

U.S. PATENT DOCUMENTS

2002/0184579 A1* 12/2002 Alvarez et al. ............... 714/719
2003/0005211 A1* 1/2003 Arimilli et al. ................ 711/5
2003/0099142 A1 5/2003 Cowles et al.

OTHER PUBLICATIONS

PCT International Preliminary Report on Patentability dated Sep. 23, 2005 and Translation dated Jun. 1, 2006.

* cited by examiner

SEMICONDUCTOR MEMORY HAVING A SHORT EFFECTIVE WORD LINE CYCLE TIME AND METHOD FOR READING DATA FROM A SEMICONDUCTOR MEMORY OF THIS TYPE

CROSS-REFERENCE TO RELATED APPLICATIONS

This application is a continuation of co-pending PCT patent application No. PCT/EP2004/007686, filed 12 Jul. 2004, which claims the benefit of German patent application serial number DE 103 32 314.7, filed 16 Jul. 2003. Each of the aforementioned related patent applications is herein incorporated by reference in its entirety.

BACKGROUND OF THE INVENTION

1. Field of the Invention

The invention generally relates to a semiconductor memory having a short effective word line cycle time and a method for reading data from a semiconductor memory.

2. Description of the Related Art

Besides its storage capacity and integration density, one of the most important properties of a semiconductor memory is the effective time needed to access its memory cell array in the case of a random access operation. Such an access time that is as short as possible for a random access operation is particularly important in network applications, in particular. The access time for randomly accessing the cell array of the semiconductor memory is often also referred to as the word line cycle time $t_{RC}$ (or row cycle time) and represents the minimum time between two operations of randomly accessing the cell array of the semiconductor memory.

FIG. 2 shows a simplified schematic timing diagram for illustrating the word line cycle time $t_{RC}$. The clock signal is schematically illustrated in the horizontal direction in the top region of FIG. 2. A read command "Cmd Read" is applied to the (conventional) semiconductor memory on a particular rising edge of the clock signal. The read command "Read" relates to the bank address "BA0". The data "Data" which have been read from the memory bank are available at the data output of the semiconductor memory after a certain delay or latency. In order to read the data "Data" associated with the given bank address "BA0" from the semiconductor memory, a relevant word line of the memory bank is conventionally "opened" in order to read the data contents of the at least one memory cell via the associated bit line(s). However, in the event of a new operation of completely randomly accessing the memory bank (complete random access), it is generally necessary to open a different word line in the case of a read command, the word line which is already open having to be closed beforehand. In the worst-case scenario, a complete so-called word line cycle which has a cycle duration of $t_{RC}$ must thus be carried out for an operation of completely randomly accessing the memory bank. In the worst-case scenario, the memory bank cannot be accessed again until after this word line cycle time has elapsed.

The prior art discloses a number of concepts for shortening the access time for randomly accessing a memory bank of a semiconductor memory. The increasing importance of fast semiconductor memories, particularly for network applications, has thus, for example, led to the development of a new class of semiconductor memories which are known under the name RLDRAM (Reduced Latency Dynamic Random Access Memory). RLDRAMs combine high storage densities with short word line cycle times $t_{RC}$. However, even shorter word line cycle times $t_{RC}$ are advantageous for particular applications.

In particular, a concept known as "multibanking" has conventionally been used at the system level for such cases, thus making it possible to "artificially" shorten the effective word line cycle time further. The concept is particularly suited to the case in which the number of read commands to be executed is large in comparison with the number of write commands, for example, in the case of so-called "look-up tables". The functional principle of such a conventional "multibanking method" for artificially shortening the effective word line cycle time is explained below with reference to FIG. 3. In a similar manner to FIG. 2, the time axis is illustrated in the horizontal direction in FIG. 3, a schematic clock signal being shown in the top region. A read command "Read" is used to address a first memory bank "B0" on a first rising clock edge. As has already been explained in connection with FIG. 2, in the worst-case scenario, a new read command cannot be applied to the first memory bank "B0" until after a word line cycle time $t_{RC}$ of this memory bank, with the result that the access time for the memory bank "B0" is equal to the word line cycle time $t_{RC}$. In order to nevertheless achieve a shorter effective access time, a specially configured memory controller is used at the system level. The external memory controller is designed in such a manner that it duplicates the data or information of a first memory bank in one or more shadow memory banks. By way of example, the same data or information as in a shadow memory bank "B1" are/is present in the first memory bank "B0". The memory bank and the shadow memory bank are preferably of identical design.

If, in the case of such a "multibanking method", another read command is applied to the first memory bank "B0" within the word line cycle time $t_{RC}$, the memory controller checks whether the so-called "$t_{RC}$ condition" has been satisfied for the memory bank "B0", that is to say the external memory controller checks whether the first memory bank "B0" is in such a memory state that would not allow the data which are to be read to be read directly. In such a memory state which will be referred to as an "open memory state" below, an open word line must first of all be closed before the new read command can be executed. If such a case is present, that is to say the "$t_{RC}$ condition" has not been satisfied for the first memory bank "B0", the external memory controller diverts the read command to the shadow memory bank "B1". Although the read command was thus intended for the memory bank "B0", the special configuration of the memory controller results in the shadow memory bank "B1" which is not in the open memory bank state being read. This shortens the effective access time or effective word line cycle time $t_{RC,eff}$ by a factor of 2, as is schematically illustrated in FIG. 3. This so-called "multibanking method" may also be carried out using a plurality of duplicated shadow memory banks in order to shorten the effective word line cycle time $t_{RC,eff}$ further in a corresponding manner.

However, the known "multibanking method" has two fundamental disadvantages. On the one hand, the external memory controller must check and log which of the memory banks are in an open memory bank state and should a read command for such an open memory bank be received, plan for the read command to be diverted in the form of a read access operation to a shadow memory bank. Such a process of diverting and logging and planning read access operations to memory banks leads to a high level of complexity of the memory controller/semiconductor memory system and thus complicates the entire system. On the other hand, on account of the prescribed bus architecture, each time data or information are/is to be written to one of the memory banks, a subsequent write command must also be applied to the shadow memory bank or shadow memory banks. The accelerated access time when reading data is thus paid for with an extended write time for writing the data.

SUMMARY OF THE INVENTION

In view of the disadvantages mentioned above, it is thus an object of the invention to specify a method for reading data from a semiconductor memory with a shortened access time for a random access operation and to specify a corresponding semiconductor memory.

According to the invention, a method for reading data from a semiconductor memory comprises the following steps in this order:

at least one first memory bank and at least one shadow memory bank which are each designed to store a multiplicity of binary data items are provided, the same data as in the first memory bank being stored in the shadow memory bank;

a command for reading data which are to be read from the first memory bank is received;

a state checking device of the semiconductor memory is used to check whether the first memory bank is in an open memory bank state, and, if the first memory bank is in the open memory bank state, the data which are to be read are read from the at least one shadow memory bank, and, if the first memory bank is not in the open memory bank state, the data which are to be read are read from the first memory bank, the open memory state being such a memory state of the memory bank which does not allow the data which are to be read to be read without previously closing an open word line of the memory bank.

In the method according to the invention, data are read from the specially configured semiconductor memory without a (an external) memory controller having to be specially designed for this purpose at the system level. Rather, the "intelligence" for shortening the word line cycle time $t_{RC}$ is implemented at the memory level and not, as is customary, at the system level. The semiconductor memory has at least one first memory bank and at least one shadow memory bank which contains the same information or data as the first memory bank. The memory banks may be of physically identical design. A read command which is externally applied to the semiconductor memory and relates to a particular bank address is first of all subjected to the operation of checking with regards to the "$t_{RC}$ condition" (mentioned initially) before being processed. To this end, the method uses a state checking device which is part of the semiconductor memory itself. The checking step uses the state checking device to assess whether the first memory bank which is to be addressed using the read command is in a so-called open memory bank state. In the sense of this application, the open memory bank state is understood as meaning such a state which does not allow the data which are to be read to be read without previously closing an open word line of the respective memory bank. In other words, the term "open memory state" is to be understood as meaning such a bank state which comprises at least part of a word line cycle in particular, closing a word line that relates to another memory address and a subsequent opening of a word line that is assigned to the data which are to be read. In other words, in the sense of this invention, the open memory state, comprising at least part of a word line cycle, does not allow the data which are to be read to be read directly from the respective memory bank but rather requires an open word line to be closed and a different word line that is assigned to the data which are to be read to be opened.

After a command for reading data which are to be read has been received, the state checking device is thus used to check whether the data which are to be read can be read directly from the first memory bank. This is the case when the first memory bank is not in the open memory bank state. If, however, the first memory bank is in the open memory bank state, the read command is not applied to the first memory bank but rather to the at least one shadow memory bank. As described in detail at the beginning, this leads to the effective word line cycle time being shortened, with the result that the access time for randomly accessing the semiconductor memory can be shortened from $t_{RC}$ to $t_{RC,eff}$.

In accordance with one preferred embodiment of the method according to the invention, the semiconductor memory comprises at least one first and at least one second shadow memory bank, and the step of reading the data which are to be read from the at least one shadow memory bank comprises the step of checking whether the first shadow memory bank is in an open memory bank state, and, if the first shadow memory bank is in the open memory bank state, the data which are to be read are read from the second shadow memory bank, and, if the first shadow memory bank is not in the open memory bank state, the data which are to be read are read from the first shadow memory bank.

In accordance with this embodiment of the method according to the invention, when a (an external) read command is input, it is not only the memory bank state of the first memory bank which is checked but also, if appropriate, the memory bank state of the shadow memory bank to be addressed. If the first shadow memory bank is in an open memory bank state, that is to say likewise does not allow the data which are to be read to be read directly, the second shadow memory bank is addressed. This concept of a plurality of shadow memory banks can be extended to a larger number, for example 3, 4, 5, 6, 7 or 8.

The step of checking whether one of the memory banks or one of the shadow memory banks is in an open memory bank state preferably comprises an operation of comparing a period of time which has elapsed since a previous read command was applied to this memory bank with a minimum word line cycle time $t_{RC}$ of this memory bank. The state checking device thus checks the memory bank state, in particular, by logging or detecting a time log since the time of the last read command for the memory bank to be checked and comparing said time log with the word line cycle time $t_{RC}$. If the period of time which has elapsed is within the word line cycle time $t_{RC}$, it is generally not possible to directly read the data which are to be read from the relevant memory bank, with the result that the "$t_{RC}$ condition" is not satisfied. Alternatively, it is possible for the active memory banks to generate a state signal which indicates that they are available for a read access operation. Such generation of a state signal by the memory banks themselves makes it possible to implement the state checking device in a particularly simple manner.

During the step of writing data to the first memory bank, the data are preferably written to the at least one shadow memory bank at essentially the same time. This is particularly advantageous since, as a result of the shadow memory bank concept being implemented in the semiconductor memory itself, it is possible to provide suitable structures or topologies which make it possible to simultaneously write data to a plurality of memory banks. The bus architectures which are to be used at the system level do not allow such a procedure, with the result that, in contrast to the invention, at the system level, the shorter effective access times must be paid for with longer write times.

The semiconductor memory is preferably an RLDRAM (reduced latency DRAM).

In accordance with another aspect of the invention, a semiconductor memory comprises at least one first memory bank and at least one shadow memory bank which are each designed to store a multiplicity of binary data items, the same data or information as in the first memory bank being stored in the shadow memory bank;

at least one control device which is signal-connected to the memory banks, the control device having a state checking device which is designed to check whether the first memory bank is in an open memory bank state, and the control device being designed, when a command for reading data which are to be read from the first memory bank is received, to use the state checking device to check whether the first memory bank is in the open memory bank state and, if the first memory bank is in the open memory bank state, to apply the read command to the at least one shadow memory bank and, if the first memory bank is not in the open memory bank state, to apply the read command to the first memory bank, the open memory state being such a memory state of the memory bank which does not allow the data which are to be read to be read without previously closing an open word line of the memory bank.

The semiconductor memory according to the invention has a control device which comprises the state checking device for checking or assessing whether a memory bank is in an open memory bank state. The control device and state checking device are thus part of the semiconductor memory itself and are not provided at the system level in the form of a memory controller.

In accordance with one preferred embodiment of a semiconductor memory according to the invention, said semiconductor memory has at least one first and at least one second shadow memory bank, the control device being designed, when the command for reading the data which are to be read is applied to the at least one shadow memory bank, to use the state checking device to check whether this shadow memory bank is in an open memory bank state and, if the first shadow memory bank is in the open memory bank state, to apply the read command to the second shadow memory bank and, if the first shadow memory bank is not in the open memory bank state, to apply the read command to the first shadow memory bank.

In accordance with another preferred embodiment, the state checking device is designed, when checking whether one of the memory banks or one of the shadow memory banks is in an open memory bank state, to compare a period of time that has elapsed since a previous read command was applied to this memory bank with a minimum word line cycle time $t_{RC}$ of this memory bank.

The control device is preferably designed, when writing data to the first memory bank, to write the data to the at least one shadow memory bank at essentially the same time.

The semiconductor memory is preferably an RLDRAM. However, the concept according to the invention may also be applied to other DRAM or SRAM memories.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The concept according to the invention will be explained by way of example below with reference to FIGS. 1 and 4 and using a preferred method for reading data from a semiconductor memory 10 according to the invention, in particular.

Figure 1:
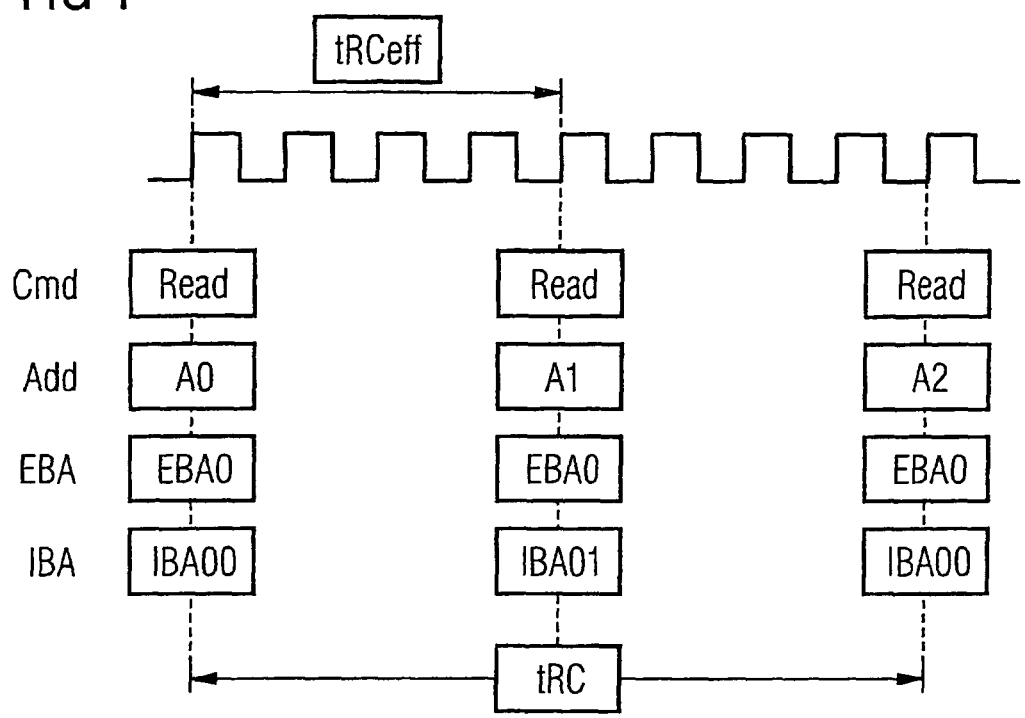
FIG. 1 shows a schematic timing diagram of a preferred method according to the invention for reading data from a semiconductor memory.
Figure 2:
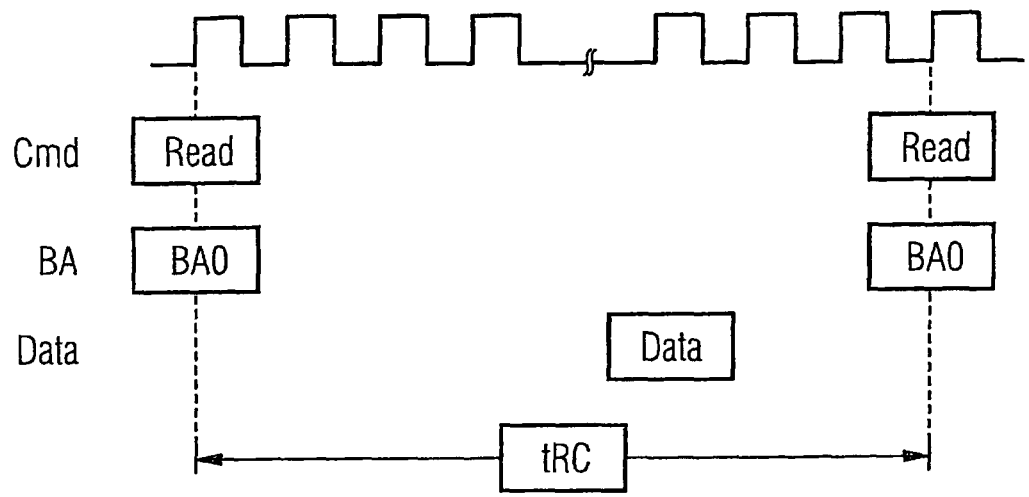
FIG. 2 shows a schematic timing diagram for explaining the word line cycle time (row cycle time $t_{RC}$)
Figure 3:
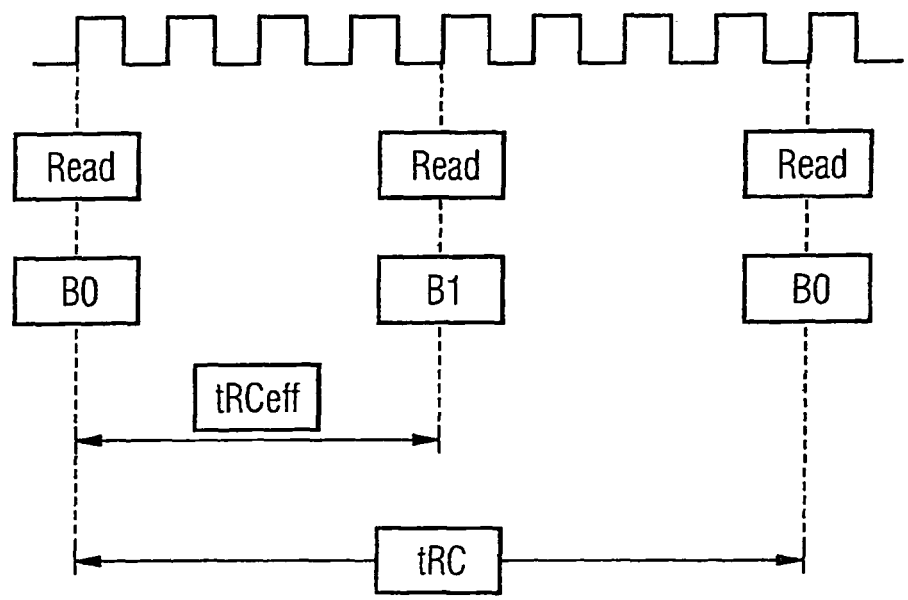
FIG. 3 shows a schematic timing diagram for explaining a conventional "multibanking method" at the system level.

As already explained at the beginning in connection with FIGS. 2 and 3, a schematic clock signal having square-wave timer pulses is illustrated in the top region of the schematic timing diagram of FIG. 1. A command "Cmd" for reading "Read" is applied on a first rising pulse edge of the clock signal.

Figure 4:
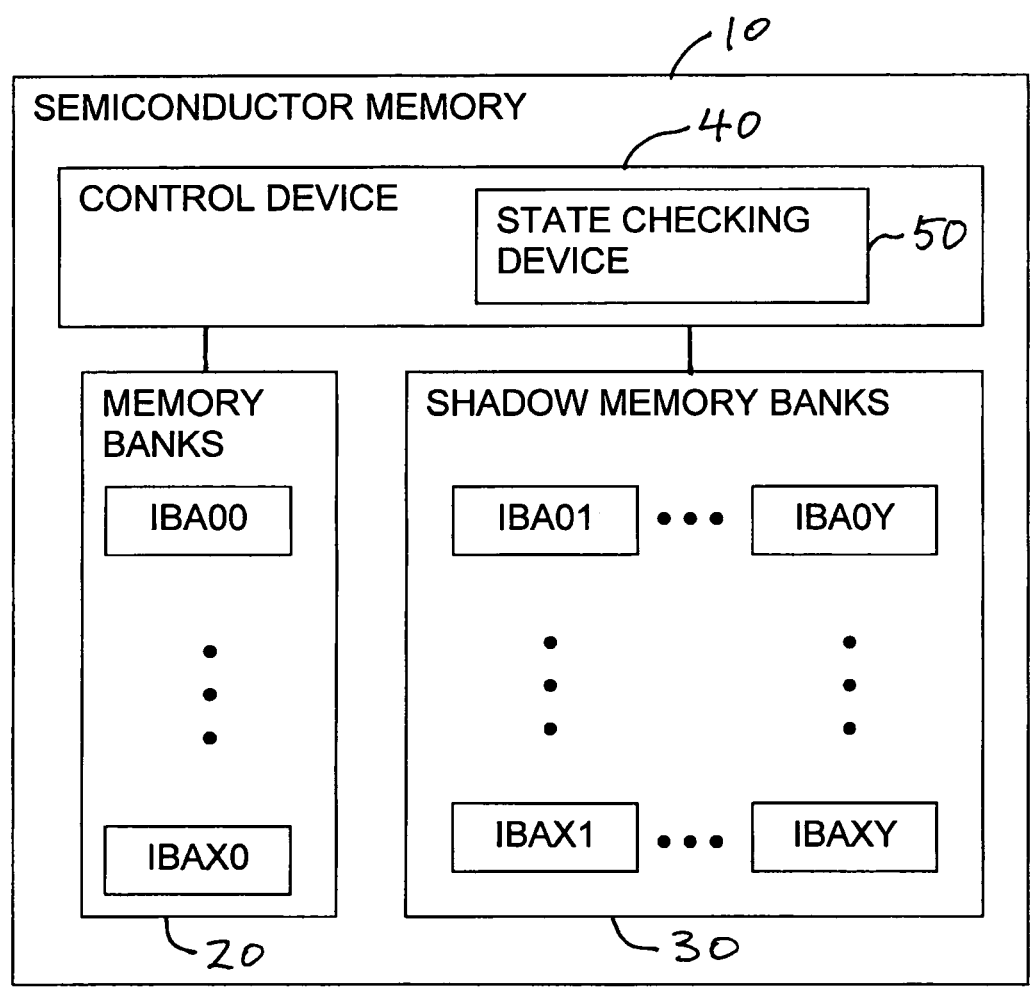
FIG. 4 is a block diagram illustrating a semiconductor memory according to one embodiment of the invention.

In the example illustrated in FIGS. 1 and 4, the total number of memory banks may be eight, by way of example (IBA00 to IBA30 and IBA01 to IBA31). However, the interface or the address input interface only provides access to half of these memory banks, that is to say only four memory banks (e.g., IBA00 to IBA30) can be accessed. The other four memory banks (e.g., IBA01 to IBA31) of the semiconductor memory are used, for shadowing purposes, as shadow memory banks which each have the same data as the first four memory banks. Access of read and write commands to the memory banks 20 and shadow memory banks 30 is effected internally by means of a control device 40 containing a state checking device 50.

In FIGS. 1 and 4, the external memory bank addresses are designated EBAx (x=0 . . . 3) and the internal memory bank addresses are designated IBAxy (x=0 . . . 3, y=. . . 0,1), x being assigned to the external memory bank address and y relating to one of the shadow memory banks. The control device 40 (or the state checking device 50 contained in the control device) logs or follows which memory bank is in an open memory bank state and automatically forwards incoming read commands to a suitable shadow memory bank. As illustrated by way of example in FIG. 1, this makes it possible to shorten the word line cycle time $t_{RC}$ by a factor of 2 to $t_{RC,eff}$. Although the read access operations (illustrated in FIG. 1) having the addresses Add A0 and A1 each relate to the external memory bank address EBA0, different memory banks can attend to these read requests by virtue of the shadow memory bank principle. The control device 40 thus forwards the incoming read commands to the internal memory bank addresses (IBA00 and IBA01).

In the case of the preferred semiconductor memory according to the invention which has been presented and is, in particular, a novel RLDRAM, a write command simultaneously opens, for example, two memory banks of the semiconductor memory, namely a memory bank and at least one associated shadow memory bank (IBx0 and IBx1) which each correspond to the external memory bank address EBx. The data or information are/is written in a parallel manner via the data input interface. In this preferred embodiment of a semiconductor memory according to the invention, the shortened access time for randomly accessing the memory's cell array thus does not need to be paid for with extended write times.

In summary, the invention relates to a novel method and to a novel semiconductor memory which is completely compatible with an existing RLDRAM interface and allows effective word line cycle times $t_{RC,eff}$ which have been shortened by a factor of 2 (or more) in comparison with conventional word line cycle times $t_{RC}$ to be obtained. An increase in the area of the semiconductor memory by a factor of, for example, two must merely be accepted for this, which is still advantageous in comparison with a 6T SRAM concept. The concept according to the invention can be applied to any memories which allow an SRAM-type access operation with or without a multiplexed address scheme.

While the foregoing is directed to embodiments of the present invention, other and further embodiments of the invention may be devised without departing from the basic scope thereof, and the scope thereof is determined by the claims that follow.

What is claimed is:

1. A method for reading data from a semiconductor memory comprising at least one first memory bank and at least a first and second shadow memory banks which are each designed to store a multiplicity of binary data items, wherein the same data are stored in the first memory bank and the first and second shadow memory banks, the method comprising:
    receiving a command for reading data which are to be read from the at least one first memory bank;
    responsive to the received command, determining whether the at least one first memory bank is in an open memory bank state utilizing a state checking device of a control device of the semiconductor memory, wherein the open memory bank state is a memory state which does not allow the data to be read from an open word line of the first memory bank until a next word line cycle, wherein the first memory bank is accessible using an address input interface in the semiconductor memory, wherein the first and second shadow memory banks are accessible using the control device and not the address input interface;
    upon determining that the first memory bank is in the open memory bank state, determining whether the first shadow memory bank is in the open memory bank state utilizing the state check device;
    upon determining that the first shadow memory bank is in the open memory bank state, reading the data from the second shadow memory bank; and
    upon determining that the first memory bank is not in the open memory bank state, reading the data from the at least one first memory bank,
    wherein during a step of writing data to the at least one first memory bank, the data are written by the control device to the first and second shadow memory banks at the same time.

2. The method of claim 1, wherein the step of checking whether the at least one first memory bank or the first shadow memory bank is in an open memory bank state comprises an operation of comparing a period of time which has elapsed since a previous read command was last applied to a respective memory bank to a minimum word line cycle time $t_{RC}$ of the respective memory bank.

3. The method of claim 1, wherein the semiconductor memory comprises a reduced latency dynamic random access memory (RLDRAM).

4. A semiconductor memory, comprising:
    a first memory bank and first and second shadow memory banks for storing binary data, the same data as in the first memory bank being stored in the first and second shadow memory banks;
    a control device of the semiconductor memory device which is signal-connected to the memory banks, the control device having a state checking device configured to determine whether the first memory bank is in an open memory bank state during which an open word line of the first memory bank must be closed prior to reading further data from the first memory bank;
    wherein the first memory bank is accessible using an address input interface in the semiconductor memory, wherein the first and second shadow memory banks are accessible using the control device and not the address input interface,
    wherein, in response to a read command received by the semiconductor memory for reading data which are to be read from the first memory bank, the control device is configured to utilize the state checking device to check whether the first memory bank is in the open memory bank state; and
        if the first memory bank is in the open memory bank state, determine whether the first shadow memory bank is in the open memory bank state,
        if the first shadow memory bank is in the open memory bank state, apply the read command to the second shadow memory bank, and
        if the first memory bank is not in the open memory bank state, apply the read command to the first memory bank,
    wherein, when writing data to the first memory bank, the control device is configured to write the same data to the first and second shadow memory banks at the same time.

5. The semiconductor memory of claim 4, wherein, when determining whether the first memory bank or the first shadow memory bank is in an open memory bank state, the state checking device is configured to compare a period of time that has elapsed since a previous read command was last applied to a respective memory bank to a minimum word line cycle time $t_{RC}$ of the respective memory bank.

6. The semiconductor memory of claim 4, wherein the semiconductor memory comprises a reduced latency dynamic random access memory (RLDRAM).

7. A memory apparatus, comprising:
    a plurality of first memory banks;
    a plurality of shadow memory banks, wherein each first memory bank is associated with first and second shadow memory banks, each containing the same data;
    a state checking device of the memory apparatus configured to determine whether a respective memory bank is in an open memory bank state during which an open word line of the respective memory bank must be closed prior to reading further data from the respective memory bank; and
    a control device of the memory apparatus configured, in response to a read command received by the memory apparatus, to:
        select one of the first memory banks to be accessed for a reading operation when the state checking device determines that the respective one first memory bank is not in the open memory bank state, wherein the plurality of first memory banks are accessible using an address input interface in the memory apparatus, wherein the plurality of shadow memory banks are accessible using the control device and not the address input interface, select the first shadow memory bank to be accessed when the state checking device determines that the selected first memory bank is in the open memory bank state and the first shadow memory bank is not in the open memory bank state, and select the second shadow memory bank to be accessed when the state checking device determines that the selected first memory bank and the first shadow memory bank are in the open memory bank state, wherein the control device is configured to write the same data to a respective first memory bank and the respectively associated first and second shadow memory banks at the same time.

8. The memory apparatus of claim 7, wherein the state checking device is configured to determine the open memory bank state based on a comparison between a period of time that has elapsed since a previous read command was last applied to a respective memory bank and a minimum word line cycle time $t_{RC}$ of the respective memory bank.

9. The memory apparatus of claim 7, wherein each respective memory bank is configured to generate a state signal which indicates whether the respective memory bank is in an open memory bank state and wherein the state checking device is configured to detect the state signal of each respective memory bank.

10. The memory apparatus of claim 7, wherein the state checking device is a part of the control device.

* * * * *